US005729562A

United States Patent [19]
Birx et al.

[11] Patent Number: 5,729,562
[45] Date of Patent: Mar. 17, 1998

[54] PULSE POWER GENERATING CIRCUIT WITH ENERGY RECOVERY

[75] Inventors: Daniel L. Birx, Oakley; Palash P. Das, Vista; Igor V. Fomenkov; William N. Partlo, both of San Diego; Tom A. Watson, Carlsbad, all of Calif.

[73] Assignees: Cymer, Inc., San Diego; Advanced Pulse Power Technologies, Inc., Oakley, both of Calif.

[21] Appl. No.: 739,873

[22] Filed: Oct. 31, 1996

Related U.S. Application Data

[63] Continuation of Ser. No. 390,709, Feb. 17, 1995.
[51] Int. Cl.$^6$ ................................................ H01S 3/00
[52] U.S. Cl. .................................................. 372/38
[58] Field of Search ....................................... 372/38

[56] References Cited

U.S. PATENT DOCUMENTS

| | | | |
|---|---|---|---|
| 3,806,829 | 4/1974 | Duston et al. . | |
| 3,849,670 | 11/1974 | Lourigan . | |
| 4,549,091 | 10/1985 | Fahlen et al. . | |
| 4,674,022 | 6/1987 | Ver Planck . | |
| 4,803,378 | 2/1989 | Richardson . | |
| 4,975,924 | 12/1990 | Iwata et al. . | |
| 5,066,928 | 11/1991 | Ikezi et al. . | |
| 5,072,191 | 12/1991 | Nakajima et al. . | |
| 5,124,629 | 6/1992 | Ball et al. . | |
| 5,138,193 | 8/1992 | Bruno et al. . | |
| 5,138,622 | 8/1992 | Friede et al. . | |
| 5,142,166 | 8/1992 | Birx . | |
| 5,177,754 | 1/1993 | Ball et al. . | |
| 5,235,608 | 8/1993 | Konishi . | |
| 5,309,462 | 5/1994 | Taylor . | |
| 5,313,481 | 5/1994 | Cook et al. | 372/38 |
| 5,315,611 | 5/1994 | Ball et al. . | |
| 5,319,665 | 6/1994 | Birx . | |
| 5,359,279 | 10/1994 | Gidon et al. . | |
| 5,448,580 | 9/1995 | Birx et al. | 372/38 |
| 5,471,492 | 11/1995 | Pidgeon et al. . | |

FOREIGN PATENT DOCUMENTS

| | | |
|---|---|---|
| 55-143331 | 10/1980 | Japan . |
| 63-171172 | 7/1988 | Japan . |
| 06164040 | 6/1994 | Japan . |
| 06237153 | 8/1994 | Japan . |
| 2204728 | 11/1988 | United Kingdom . |

OTHER PUBLICATIONS

"Development And Operation Of A Solid–State Switch For Thyratron Replacement," Dreifuerst et al., University of California, Lawrence Livermore National Library (1991).
"Basic Principles Governing The Design Of Magnetic Switches," Birx et al., University of California, Lawrence Livermore National Library (1980).
"The Use of Saturable Reactors as Discharge Devices for Pulse Generators," Melville, Discharge Devices for Pulse Generators Paper No. 1034, 185–207 (1951).
"High Power Pulse Generation Using Semiconductors and Magnetic Cores," Lassiter et al., 511–517 (1960).
"The Application of Magnetic Pulse Compression to the Grid System of ETA/ATA Accelerator," Birx et al., IEEE 10–13 (1982).
"Magnetic Compressors: High Power Pulse Sources," Energy and Technology Review, 11–19 (1983).

*Primary Examiner*—Leon Scott, Jr.
*Attorney, Agent, or Firm*—Roger W. Blakely, Jr.

[57] ABSTRACT

A high voltage pulse power generating circuit capable of providing energy recovery is disclosed. The energy efficient pulse generating circuit source comprises a high voltage charge storing element which is periodically discharged into a compressor circuit. An energy recovery circuit coupled to the compressor circuit reverses the polarity of energy dissipated by the pulse power generating circuit and transfers the waste energy back to the power source. In a preferred embodiment, the pulse power generating circuit of the present invention utilizes an SCR switch for periodically discharging the charge storing element. This embodiment of the present invention provides pulses consistently and will not provide even a single missed pulse.

64 Claims, 4 Drawing Sheets

PULSE POWER GENERATING CIRCUIT WITH ENERGY RECOVERY

This is a Continuation Application of Application No. 08/390,709, filed Feb. 17, 1995 pending.

The present invention was made with support from the United States Government under Contract No. DAAH01-93-C-R181 awarded by the United States Army Missile Command. The United States Government has certain rights in the invention.

BACKGROUND OF THE INVENTION

1. Field of the Invention

The present invention relates generally to pulse power sources and more particularly, to an apparatus and method for providing high voltage pulse power and energy recovery for use in excimer and other pulsed lasers.

2. Description of the Prior Art

In applications where pulsed lasers are operated for extended periods of time, there is a need for energy efficiency, long term reliability and high component life-times. In these applications, magnetic compression circuits in conjunction with solid state switches have recently been utilized to supply pulse power because of the reliability and useful life of the magnetic compression circuits and solid state switches.

Such magnetic compression circuits generally utilize a multi-stage LC network to provide the power compression. Various techniques exist for increasing the power output of such devices, including the use of complicated pulse generating networks such as that described in U.S. Pat. No. 5,138,622 to Friede et al. and the use of multi-stage magnetic modulators to achieve a high packing factor. These techniques, however, are complex and expensive to implement and their use provide long term unreliability. Specifically, they are energy inefficient and promote short laser component life-times. For example, after the laser discharges, energy left in the circuits is dissipated in the laser, resulting in reduced electrode life.

In addition, the cost of conventional thyratron-based pulse power lasers is high, while the lifetime of the thyratron is limited by cathode and anode erosion. The most serious effect of cathode erosion is a decrease in thyratron switching efficiency. With age, high operating voltages are required to drive the thyratron, which further stresses the thyratron, until eventual replacement is necessary.

Furthermore, anode erosion in conventional thyratron-based pulse power lasers severely reduces the thyratron's high voltage hold-off ability. This causes the thyratron to exhibit occasional prefiring, which results in a premature and weak laser pulse. In applications where high precision is required, such as the manufacture of silicon wafers, prefiring can result in the complete rejection and disposal of the silicon wafers, which is an expensive undertaking.

Accordingly, there is a need in the technology to provide an apparatus and method of increasing the energy efficiency of magnetic compression circuits which is easy to implement, which does not exhibit prefire behavior and which also minimizes electrode erosion.

BRIEF SUMMARY OF THE INVENTION

A high voltage pulse power generating circuit capable of providing energy recovery is disclosed. The energy efficient pulse power generating circuit comprises a high voltage charge storing element which is periodically discharged into a compressor circuit. An energy recovery circuit coupled to the compressor circuit reverses the polarity of energy recovered from the laser by the pulse power generating circuit and transfers the what would have been waste energy back to the power source. In a preferred embodiment, the pulse power generating circuit of the present invention utilizes an SCR switch for periodically discharging the charge storing element. This embodiment of the present invention provides pulses consistently and will not provide even a single missed pulse.

DETAILED DESCRIPTION OF THE INVENTION

The present invention relates to a pulse power generating circuit which is capable of recovering energy that otherwise would be wasted in a system through a transfer of the dissipated energy back into the power source of the system.

Figure 1:
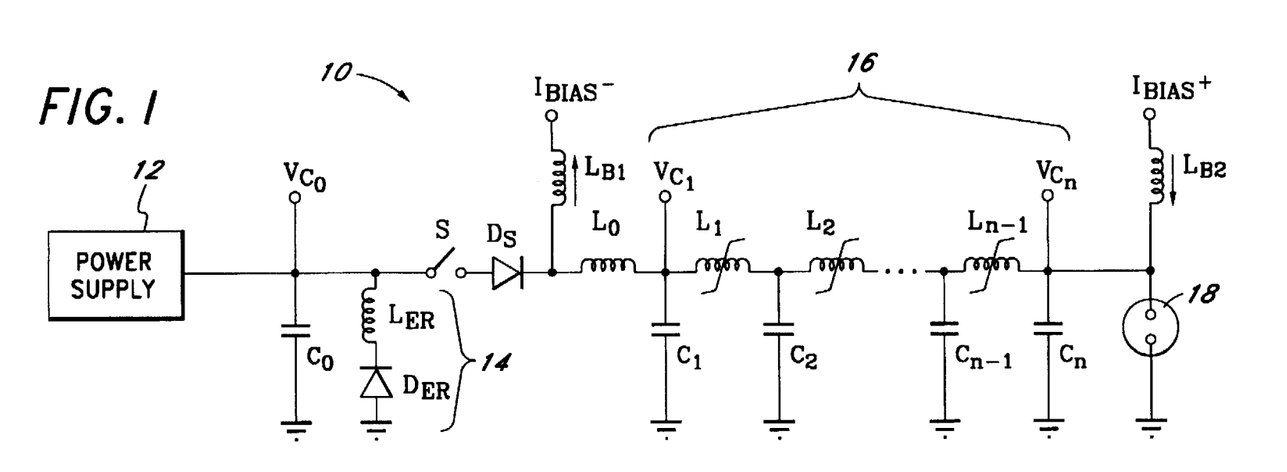
FIG. 1 is a schematic diagram of a preferred embodiment of the pulse power generating circuit of the present invention.

FIG. 1 is a schematic diagram of a preferred embodiment of the pulse power generating circuit 10 of the present invention. The pulse power generating circuit 10 comprises a high voltage DC power supply 12, an energy storage capacitor $C_0$, an inverting circuit 14, a solid state switch S and a pulse compressor circuit 16 for compressing the duration and increasing the voltage of pulses applied. The pulse power source is coupled to a load 18, typically a pulse discharge load such as an excimer laser.

Figure 2:
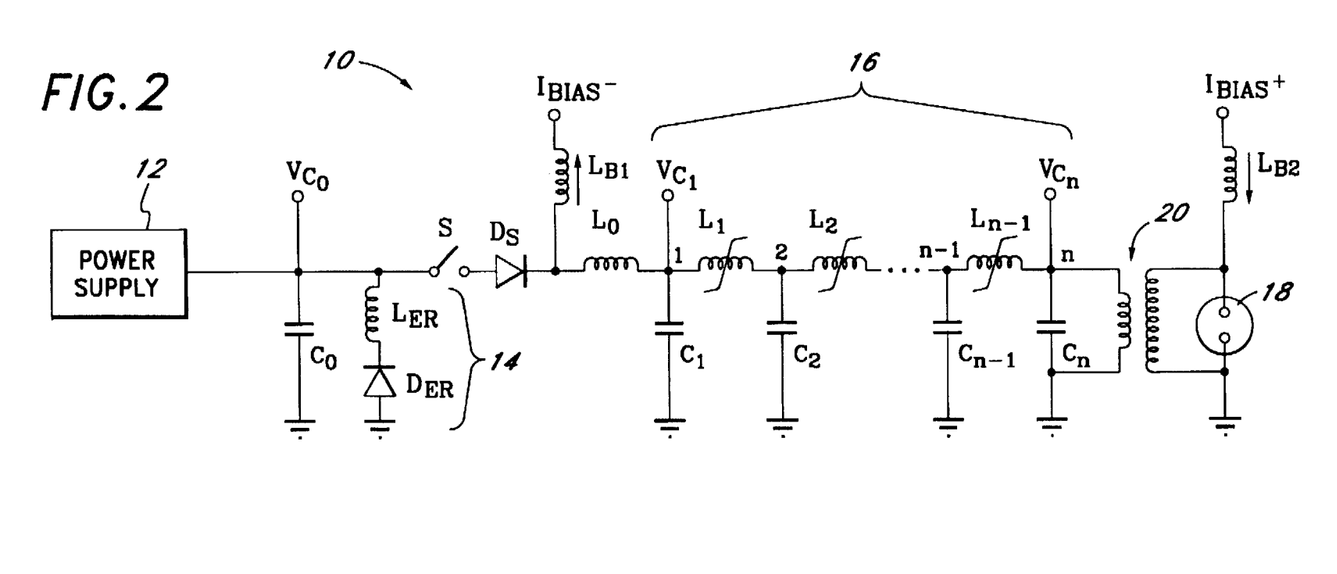
FIG. 2 is a schematic diagram of an alternate embodiment of the pulse power generating circuit of the present invention.

FIG. 2 is a schematic diagram of an alternate embodiment of the pulse power generating circuit 10 illustrated in FIG. 1. In this alternate embodiment, a step up transformer 20 is coupled to the output of the compression circuit 16. Alternatively the transformer 20 may instead be coupled to the power generating circuit at one of several nodes (for example, nodes 1, 2, . . . n) in the pulse compressor circuit 16, depending on design requirements. A transformer 20 coupled to the circuit 10 at a node closer to the power supply 12 will subject downstream components of the pulse compressor circuit 16 to a higher voltage but lower current than the embodiment of FIG. 2, and of course will effect the design of such components because of the different impedance and other operating conditions they will be subjected to. Conversely, a transformer 20 coupled to the circuit 10 at a node closer to the load 18 will allow use of low voltage but high current components supplying the transformer. Further the transformer itself can be somewhat different, depending on its placement, as stepping the voltage up to the desired high level before the final pulse compressor reduces the required peak current capabilities of the transformer.

In a preferred embodiment, the power supply 12 is a 0–1 K volt D.C. power supply, with the pulse power supply providing an energy per pulse of 2 Joules in a pulse width of 100 nanoseconds at approximately a 1 Khz pulse rate. The D.C. supply 12 is used to charge capacitor $C_0$, shown as a single capacitor, though typically comprising a bank of parallel connected capacitors. For instance, to obtain a 16 microfarad capacitance for capacitor $C_0$, 160 0.1 microfarad, 1000 volt capacitors may be connected in parallel.

The switch S may be a silicon controlled rectifier (SCR), an insulated-gate bipolar transistor (IGBT), a metal-oxide semiconductor field-effect transistor (MOSFET), a MOS-FET controlled thyristor (MCT), or any other suitable switching element as known in the technology. The pulse power generating circuit 10 preferably comprises a diode $D_s$ connected in series with the switch S. The inclusion of $D_s$ in the circuit 10 ensures that the circuit 10 is nonconductive with respect to reverse current, as will be described in detail in the section below. In another preferred embodiment, the pulse power source 10 further comprises an inductor $L_0$ selected in conjunction with $C_1$ to provide a time constant for the LC combination to slightly slow the buildup of current flow through the switch S so that the switch may become completely closed prior to high current flow through the switch. This substantially reduces power dissipation in the switch, conserving energy and reducing the heating in the switch and peak current conduction requirement of the switch to reasonably manageable levels. However, it provides a current pulse through the switch which is too low in current and too long in duration to itself provide the intended output for the pulse power source without pulse compressor, provided by the rest of the circuit.

In a preferred embodiment, the switch S is a solid state switch such as an SCR switch. The use of an SCR switch in the pulse power generating circuit 10 of the present invention in a laser offers a distinct advantage. Specifically, it was found that laser systems utilizing the pulse power generating circuit 10 with an SCR switch generate pulses consistently. In fact, the pulse power generating circuit 10 utilizing an SCR switch does not provide even a single missed pulse throughout the life of the laser. This is because SCR switches do not suffer from gradual degradation nor exhibit prefire behavior, as will be discussed in greater detail in the following sections.

The pulse power source 10 also includes bias inductors $L_{B1}$ and $L_{B2}$, each of which is connected at one end to a current source, $I_{BIAS}-$ and $I_{BIAS}+$ respectively, and at the other end, to compressor circuit 16. As shown in FIG. 1, a negative current relative to the desired output pulse is used to bias the compressor circuit 16, as will be discussed in greater detail below. The bias current is supplied through inductors of relatively high inductance to provide relatively high time constants in the bias circuit relative to the pulse rate of the pulse power source to isolate the bias current source from the pulse power source itself. Energy recovery is facilitated in part by inverting circuit 14 which comprises inductor $L_{ER}$ and energy recovery diode $D_{ER}$.

The compressor circuit 16 comprises banks of capacitors $C_1, C_2, \ldots C_{n-1}$ and $C_n$ and one or more saturable core inductors $L_1, L_2, \ldots, L_{n-1}$ connected in a ladder network. As shown in FIG. 1, a first saturable core inductor $L_1$ is connected between $C_1$ and $C_2$, a second saturable core inductor $L_2$ may be connected in series between $C_2$ and $C_3$, ..., and a saturable core inductor $L_{n-1}$ is connected in series between $C_{n-1}$ and $C_n$.

The circuit of FIG. 2 is identical to that of FIG. 1 with the exception of the addition of the step up transformer 20 shown between the output of the pulse power source and the load 18, for the preferred embodiment an excimer laser, though the step up transformer may be inserted in circuit at $C_1$ or any of the capacitors between $C_1$ and $C_n$. The presence and location of the transformer does not effect the function of the other components of the pulse power supply, though being an impedance transforming device (transforming voltages and currents), the values, current capacities and voltage capabilities of the components from and including the power supply 12 to the primary of the transformer will differ substantially from the corresponding components of FIG. 1, even though the same will normally be chosen to have substantially the same time constants as the embodiment of FIG. 1.

Figure 3:
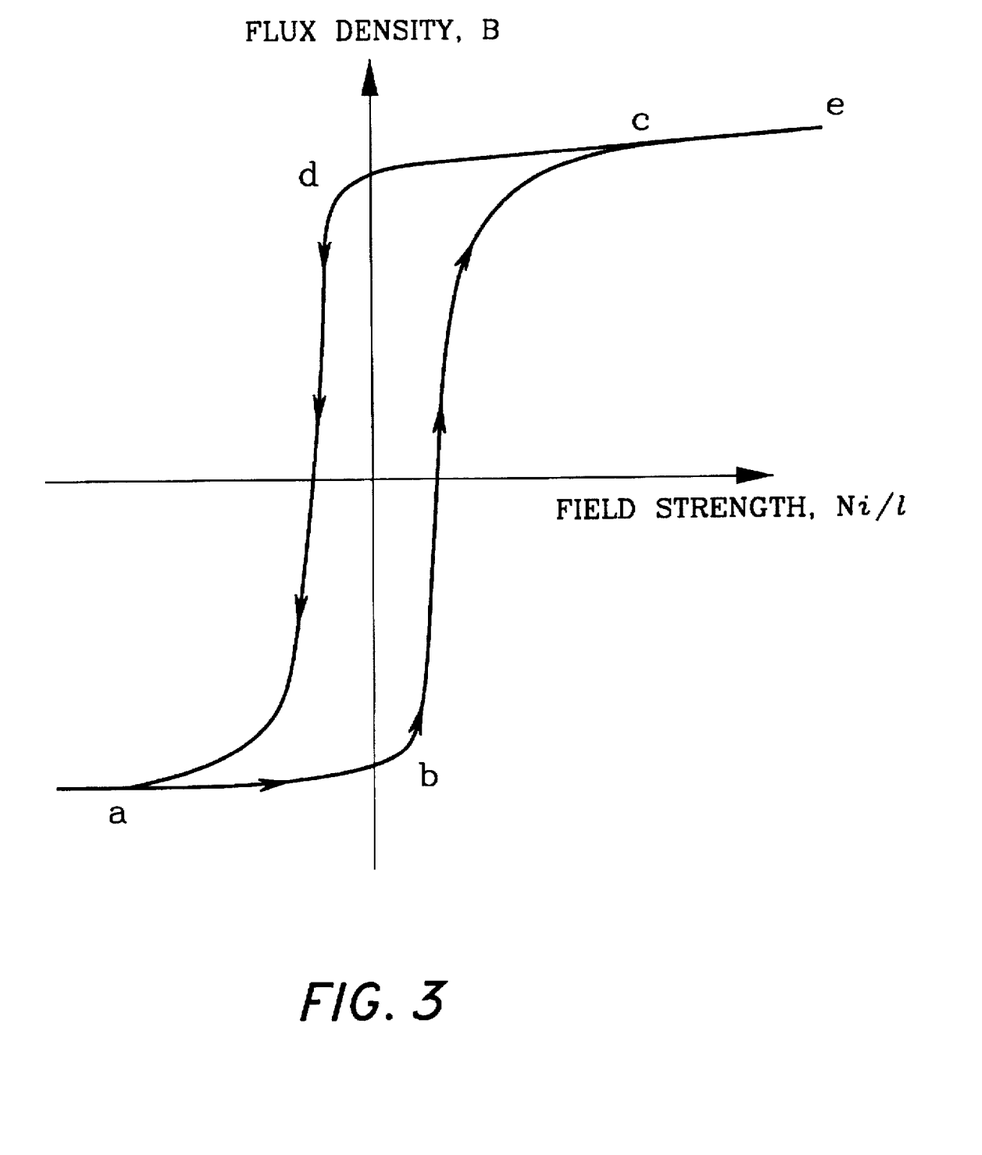
FIG. 3 is a graphical representation of the relationship between the flux density and field strength in a typical saturable core inductor.

The method of operation of the present invention will now be discussed. FIG. 3 is a graphical representation of the relationship between the flux density B and magnetizing force per unit length $^{Ni}/_l$, characteristic of the major hysteresis loop of a saturable core inductor, where N in the number of inductor coil turns on the core, 1 is the length of the core and i is the current in the inductor.

In addition, the total flux $\Phi$ in the saturable core is given by the equation:

$$\Phi = BA \qquad (1)$$

where B is the flux density and A is the cross-sectional area of the core.

As also known in the technology, the relationships between the electromotive force (emf) induced in a coil having N turns, the rate of change of flux in the core about which the coil is wound and the rate of change in current in the coil are:

$$e = N\frac{d\Phi}{dt} = L\frac{di}{dt} \qquad (2)$$

where L is the inductance of the inductor.

Substituting equations (1) into equation (2), we have $$N\frac{d\Phi}{dt} = N\frac{d(BA)}{dt} \qquad (3)$$

Thus, $$L\frac{di}{dt} = NA\frac{dB}{dt} \qquad (4)$$

$$L = NA\frac{dB}{di} \qquad (5)$$

Thus, the inductance L of a coil is directly proportional to the rate of change of B with respect to i.

Thus, with reference to FIG. 3, the value of $$\frac{dB}{di}$$

and thus the inductance when the inductor is operating along the line a-b, the line c-d and anywhere along the line c-e of the curve is small since the gradient of the curve is slight. However, the value of $$\frac{dB}{di}$$

is large along line b-c and line d-a where the gradient of the curve is steep. Thus, starting at point a (set by the negative bias current $I_{BIAS}-$ see FIGS. 1 and 2), L is relatively small along line a-b. However, once enough current passes through the inductor coil in the positive direction to start to substantially change the magnetization of the core, the inductance L of the inductor suddenly greatly increases, as shown by the change of $$\frac{dB}{dt}$$

at point b.

The inductance remains large until point c is reached, at which time the inductance returns to a low value, allowing the current through the inductor to rapidly rise to point e and beyond, and to later return to point d, all in accordance with the voltage across the inductor. Between point e and point a, the inductance is again relatively high.

The method of the present invention provides a bias current from $I_{BIAS-}$ and $I_{BIAS+}$ through $L_{B1}$ and $L_{B2}$ to the compression circuit 16 to ensure that the saturation inductors $L_1, L_2, \ldots L_{n-1}$ are biased to operate along line c-e of the curve as shown in FIG. 3. This ensures that the current passing through saturable inductors $L_1, L_2, \ldots L_{n-1}$ is conducted in one direction for energy recovery. It also ensures a large time constant for each LC stage of the compression circuit 16 so that sufficient time is provided for full energy transfer from one capacitor (e.g., $C_1$) to another (e.g., $C_2$) through the inductor (e.g., $L_1$). At the end of a transfer cycle, the inductors $L_1, L_2, \ldots L_{n-1}$ are biased to ensure that their corresponding inductance is reduced to that at point a in FIG. 3, so that proper biasing of the inductors $L_1, L_2, \ldots L_{n-1}$ may be accomplished during the next pulsing cycle. Specifically, the inductance of the inductors $L_1, L_2, \ldots L_{n-1}$ must increase with the corresponding increase of positive or uni-directional current in the inductor, as will be discussed in detail below.

The operation of the pulse power generating circuit 10 will be described with reference to FIG. 3 and the timing diagrams illustrated in FIGS. 4A–4E. With the D.C. power supply 12 on prior to the time $t_0$ (when switch S is open), capacitor $C_0$ is charged by the current supplied by the D.C. power supply 12. When fully charged, the voltage across capacitor $C_0$ is $V_{C0}$ (see FIG. 4A). At $t_0$, the switch S closes, and the energy stored in capacitor $C_0$ is transferred to $C_1$ (see FIG. 4B) by action of the LC circuit comprising $L_0$, $C_0$ and $C_1$ with a time constant of approximately $$\left( \frac{L_0 C_0 C_1}{C_0 + C_1} \right)^{1/2},$$

$C_1$ becoming nearly fully charged and the current in inductor $L_0$ reducing substantially but still remaining positive at time $t_1$. Inductor $L_0$ is included in the circuit to purposely provide a sufficiently large time constant in this energy transfer to ensure that S is fully switched before high currents are encountered, and to limit the maximum current through the switch for a given energy transfer to a value manageable by a solid state switch by extending the time of the transfer. As capacitor $C_0$ starts to discharge through switch S and capacitor $C_1$ begins to charge during this transfer, the current in the coil of saturable inductor $L_1$ rapidly changes from the negative bias current of point a to the low positive current of point b of FIG. 3, at which point the inductance jumps to a relative high value to limit the rate of further current increase through $L_1$.

At time $t_1$, while the current in inductor $L_0$ is low but still positive, the saturable core of inductor $L_1$ saturates, at which time the inductance of inductor $L_1$ jumps to a low value, allowing the current there through to rise to a very high value to transfer the energy from capacitor $C_1$ to capacitor $C_2$ with a time constant approximately equal to $$\left( \frac{L_{1s} C_1 C_2}{C_1 + C_2} \right)^{1/2},$$

where $L_{1s}$ is the inductance of the inductor $L_1$ with the core in saturation (line c-e in FIG. 3). Note that this time constant may be substantially shorter than the time constant $$\left( \frac{L_0 C_0 C_1}{C_0 + C_1} \right)^{1/2}$$

because $L_{1s}$ may be made much less than $L_0$.

In the manner described above, energy is transferred through each stage of the compressor circuit 16, if more than one stage is used, compressing the pulse in time in one or more stages as desired, and if of low voltage originally, being stepped up in voltage where desired. When $C_{n-1}$ is substantially fully charged and the core of inductor $L_{n-1}$ saturates, the energy is coupled through the saturated inductor from $C_{n-1}$ to $C_n$ in a short time period pulse, with the voltage across $C_n$ being applied to the laser 18.

At time $t_L$, the voltage across $C_n$ builds to the level required to initiate discharge in the laser, and the laser 18 fires. Energy stored in $C_n$ and still being fed to $C_n$ through the inductor is delivered to the laser discharge in the compressed time period of the pulse power supply (see FIG. 4E). After discharging, $C_n$ is driven negative. When this occurs, $L_{n-1}$ is already saturated for current flow from $C_{n-1}$ to $C_n$. Thus, instead of having energy ringing in the laser 18, eroding the electrodes, the saturated state of $L_{n-1}$ causes the reverse charge on $C_n$ to be transferred resonantly back into $C_{n-1}$ as shown in FIG. 4D. This transfer is accomplished by the continued forward flow of current through $L_{n-1}$.

Figure 4A:
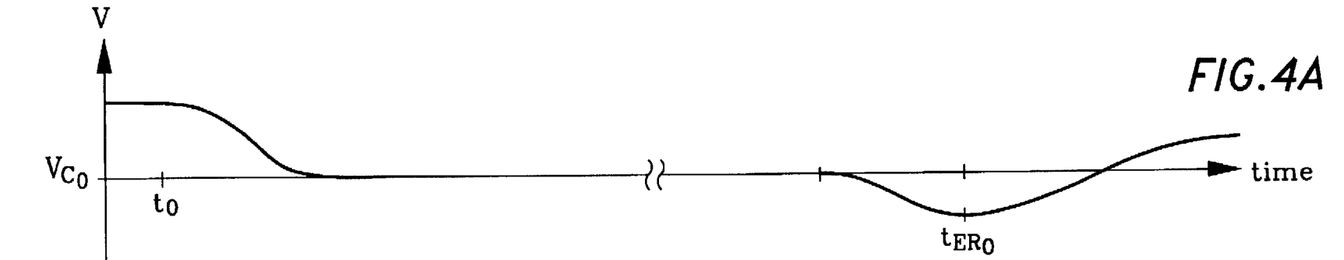
FIGS. 4A–4E are timing diagrams illustrating the energy transfer and recovery cycles in the pulse power generating circuit of the present invention.
Figure 4B:
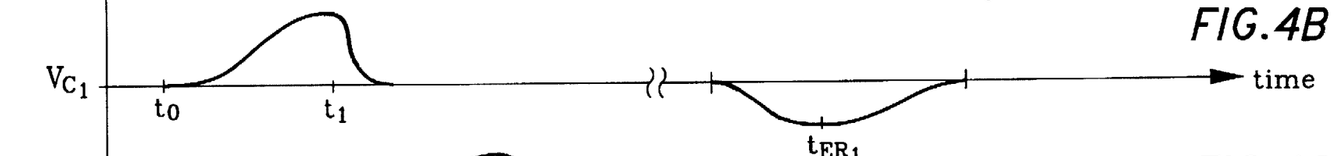
Figure 4C:
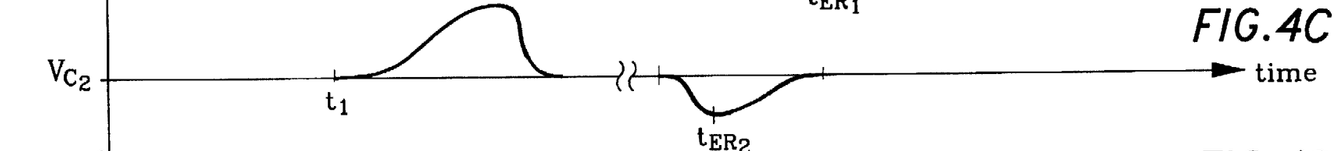
Figure 4D:
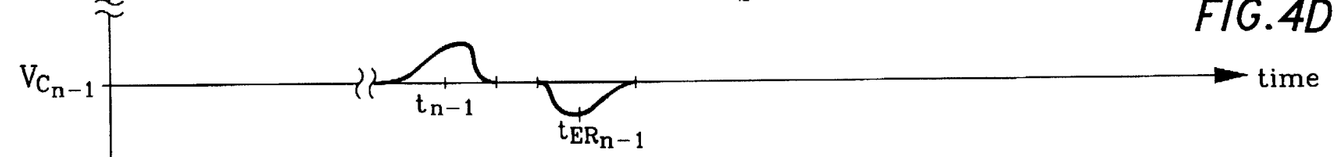
Figure 4E:
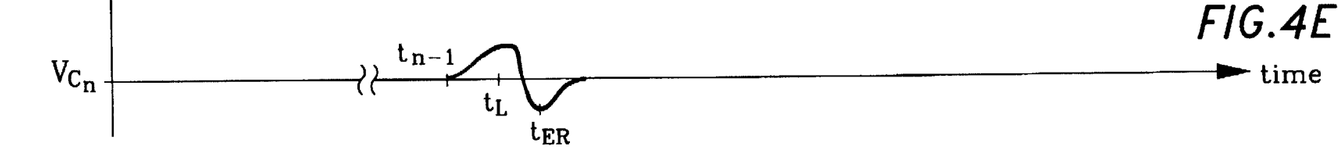

When energy is transferred back into $C_{n-1}$, $C_{n-1}$ is driven negative with respect to $C_{n-2}$. This process repeats back up the L-C ladder network of the pulse compressor circuit until the energy which would have been destructively dissipated in the load 18, is transferred from $C_{n-1}$ to $C_{n-2}$. This transfer process continues until the energy in $C_n$ is passed to $C_0$, as shown in FIG. 4A. It should be noted that such reverse energy transfer is possible only if all saturable inductors $L_n, \ldots L_{n-1}$ remain forward conducting to operate along curve c-e of FIG. 3, since the voltage of $C_n$ with respect to $C_{n-1}$ (and similarly, $C_{n-1}$ with respect to $C_{n-2}, \ldots$ etc.) must be negative for the energy propagation to be accomplished. Thus, an important factor in the design of the pulse power generating circuit 10 is that all the coils of all saturable inductors $L_1, L_2, \ldots L_{n-1}$ must be forwardly conducting to operate in the proper state for one way current transfer until waste energy is fully recovered.

When the waste energy is propagated back into $C_0$, $C_0$ is driven negative with respect to its initially stored charge, and switch S is opened. The inverting circuit 14, comprising an inductor $L_{ER}$ and a solid state diode $D_{ER}$ coupled to ground reverses this polarity through resonant free wheeling—a half cycle of ringing of the LER-$C_0$ circuit as clamped against reversal of the current in inductor $L_{ER}$ by diode $D_{ER}$, with the net result that the energy is recovered by the partial recharging of capacitor $C_0$, thereby the energy which otherwise would have contributed to erosion of the laser electrodes and reducing the supply requirements of the D.C. power supply.

Figure 5:
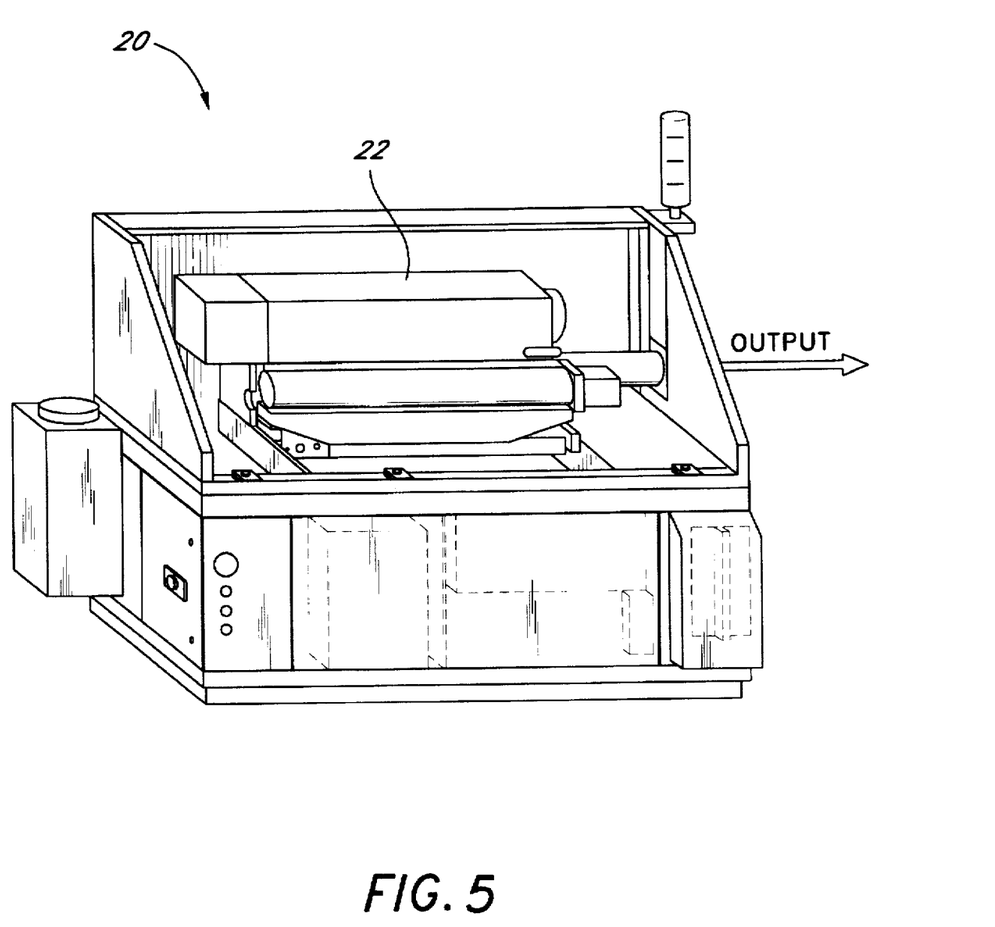
FIG. 5 is a perspective view of a laser system utilizing the pulse power generating circuit of the present invention.

The pulse power generating circuit of the present invention may be utilized in lasers which operate on the principle of transverse discharge. These lasers include systems which discharge at high pressure, such as $CO_2$ lasers, copper vapor lasers and excimer lasers including KrF excimer lasers. FIG. 5 illustrates a laser module 20 which may utilize the pulse power generating circuit 10 (enclosed in chassis 22) of the present invention as a power source. A typical example of such a laser includes the HPL-100 laser module manufactured and sold by Cymer Laser Technologies, assignee of the present invention.

Several advantages exist through the application of the pulse power generating circuit of the present invention. First, by using the pulse power generating circuit, the energy efficiency of a laser system is increased while electrode erosion from after discharge ringing is minimized, since the waste energy which would otherwise be left ringing in the laser 18 is effectively removed from the laser 18. The energy reflected by the laser chamber due to impedance mismatch no longer rings back and forth between the pulse power generating circuit and the laser chamber since this energy is recovered by the pulse power generating circuit of the present invention. As described, the pulse power generating circuit is designed to transmit this reflected energy all the way back through the pulse forming network into $C_0$. Upon recovery of this energy onto $C_0$, the switch turns off, ensuring that this captured energy remains in $C_0$. Thus, regardless of the operating voltage, gas mixture or chamber condition, the voltage waveform across the laser electrodes exhibits the behavior of a well-trained system. This performance is maintained over all laser operating conditions.

As discussed, after-ringing has been found to have a detrimental impact on the laser chamber's electrode lifetime. After the main laser discharge, current flow between the chamber electrodes becomes nonuniform and breaks up into localized areas of high current density called streamers. Elimination of this after-ringing by the solid state pulse power generating circuit starves the streamers of energy and reduces the amount of electrode damage caused by these streamers.

Secondly, by incorporating an SCR switch in a preferred embodiment of the pulse power generating circuit of the present invention, prefiring in the laser system can be eliminated while predictability and reliability of the laser system can be increased. This is because SCR switches, unlike conventional thyratron switches, neither suffer from gradual degradation nor exhibit prefire behavior. Specifically, the use of SCR switches in pulse power generating circuits has been demonstrated to last for greater than 30 billion pulses under typical operating conditions without a single missed pulse or failure of the pulse power generating circuit. In addition, experimental results in a prototype of the pulse power generating circuit of the present invention has thus far accumulated in excess of 6 billion pulses without a single failure or missed pulse. It has also been determined experimentally that the pulse power generating circuit of the present invention exhibits the same efficiency at 6 billion pulses as it did at 300 million pulses.

Thirdly, the use of the solid state pulse power generating circuit of the present invention in a laser has increased the useful chamber life of the laser by 100%, from 3 billion pulses to 6 billion pulses, without any degradation in performance.

Finally, three other factors are significant in the reduction of cost of operation in using a solid state pulse power generating circuit instead of a thyratron-based pulse power system. The most significant reduction in cost is a ten-fold increase in the expected lifetime of a laser system using the pulse power generating circuit of the present invention. The increase in expected lifetime is from 3 billion pulses for a thyratron pulse power laser system to 30 billion pulses for a solid state pulse power laser system. The second factor in overall system cost reduction is the complete elimination of missed laser pulses and thus the reduction in wafer level rework. The third factor involves a reduction in downtime for laser service procedure. A thyratron-based pulse power circuit used on a typical laser system must go through a 10 minute warm-up period to achieve proper thyratron temperature. The solid state pulse power generating circuit of the present invention requires no warm-up time, and thus each laser service procedure can be shortened by approximately 10 minutes.

Although the invention has been described in terms of a certain preferred embodiment, other embodiments apparent to those skilled in the art are also within the scope of this invention. Accordingly, the scope of the invention is intended to be defined only by the claims which follow.

What is claimed is:

1. A pulse power generating circuit comprising:
    a capacitor for storing a charge;
    a magnetic pulse compressor circuit having at least one stage, said at least one stage comprising a capacitor and a saturable inductor;
    a biasing circuit for encouraging the inductor of the at least one stage into reverse saturation;
    a switch coupled at one end to said capacitor and another end to said magnetic pulse compressor circuit, for periodically applying the charge stored in said capacitor as an input to said compressor circuit, the compressor circuit providing a forward current output pulse in response to the input, said compressor circuit maintaining a forward current while resonantly providing a reverse charge which is reflected from a load coupled to said compressor circuit; and
    an inverting circuit coupled in parallel with said capacitor for storing and inverting said reverse charge to obtain an inverted charge, said inverting circuit also providing said inverted charge to said capacitor through said switch during a next pulse.

2. The circuit of claim 1, wherein said magnetic pulse compressor circuit comprises a second stage comprising a second capacitor and a second saturable inductor.

3. The circuit of claim 2, wherein said magnetic pulse compressor circuit comprises a third stage comprising a third capacitor and a third saturable inductor, and an output capacitor coupled in parallel with said third stage.

4. The circuit of claim 3, further comprising a transformer, said transformer having a primary winding and a secondary winding, said primary winding being coupled to one of said stages and said secondary winding being coupled to a next stage.

5. The circuit of claim 1, further comprising a linear inductor, said linear inductor being coupled in series with said switch.

6. The circuit of claim 1, further comprising a second capacitor coupled to said capacitor for storing a charge.

7. The circuit of claim 1, wherein said inverting circuit comprises an inductor.

8. The circuit of claim 1, further comprising a power source, said power source providing said charge to said capacitor.

9. The circuit of claim 1, wherein said magnetic pulse compressor circuit is coupled to a load.

10. The circuit of claim 9, wherein said load is a laser.

11. The circuit of claim 10, wherein said laser is operable on a transverse discharge.

12. The circuit of claim 11, wherein said laser is an excimer laser.

13. The circuit of claim 10, further comprising a transformer, said transformer having a primary winding and a secondary winding, said primary winding being coupled to the output of said magnetic pulse compressor circuit and said secondary winding being coupled to said load.

14. A method of generating pulse power, comprising the steps of:

storing a charge in a capacitor;

periodically applying the charge stored as an input to a magnetic pulse compressor circuit having at least one stage, said at least one stage comprising a capacitor and a saturable inductor;

providing a biasing circuit for encouraging the inductor of the at least one stage into reverse saturation;

providing a forward current output pulse in response to the input, said compressor circuit also maintaining a forward current while resonantly providing a reverse charge that is reflected from a load coupled to said magnetic pulse compressor circuit;

recovering said reverse charge by inverting said reverse charge to obtain an inverted charge; and providing said inverted charge to said capacitor during a next pulse.

15. The method of claim 14, wherein in said periodically applying step, said magnetic pulse compressor circuit comprises a second stage comprising a second capacitor and a second saturable inductor.

16. The method of claim 15, wherein said magnetic pulse compressor circuit comprises a third stage comprising a third capacitor and a third saturable inductor, and an output capacitor coupled in parallel with said third stage.

17. The method of claim 16, further comprising a transformer, said transformer having a primary winding and a secondary winding, said primary winding being coupled to one of said stages and said secondary winding being coupled to a next stage.

18. The method of claim 14, wherein said periodically applying step is conducted by means of a switch.

19. The method of claim 18, further comprising a linear inductor, said linear inductor being coupled to said switch.

20. The method of claim 14, wherein in said storing step, said capacitor is coupled to a second capacitor.

21. The method of claim 14, wherein an inverting circuit is used in said recovery step, said inverting circuit comprising an inductor.

22. The method of claim 14, further comprising the step of providing a power source for providing said charge to said capacitor.

23. The method of claim 14, further comprising the step of providing said output pulse to a load coupled to said magnetic pulse compressor circuit.

24. The method of claim 23, wherein said load is a laser.

25. The method of claim 24, further comprising the step of providing said output pulse to a transformer, said transformer having a primary winding and a secondary winding, said primary winding being coupled to the output of said magnetic pulse compressor circuit and said secondary winding being coupled to said load.

26. A high-voltage pulse power laser system, comprising:

a power source for supplying a charge;

a capacitor for storing said charge;

a magnetic pulse compressor circuit having at least one stage, said at least one stage comprising a capacitor and a saturable inductor;

a biasing circuit for encouraging the inductor of the at least one stage into reverse saturation;

a solid state switch coupled at one end to said capacitor and at a second end to said magnetic pulse compression circuit, for periodically applying the charge stored in said capacitor as an input to said compressor circuit, the compressor circuit providing a forward current output pulse in response to the input, said compressor circuit also maintaining a forward current while resonantly providing a reverse charge that is reflected from a load coupled to said magnetic pulse compressor circuit;

a laser coupled to said magnetic pulse compressor circuit, said laser receiving said output pulse; and an inverting circuit coupled in parallel with said capacitor for storing and inverting said reverse charge to obtain an inverted charge, said inverting circuit also providing said inverted charge to said capacitor through said switch.

27. The system of claim 26, further comprising a pair of current bias terminals coupled to said magnetic pulse compressor circuit, said pair of current bias terminals for providing a bias current to said compressor circuit.

28. The system of claim 26, wherein said magnetic pulse compressor circuit comprises a second stage comprising a second capacitor and a second saturable inductor.

29. The system of claim 28, wherein said magnetic pulse compressor circuit comprises a third stage comprising a third capacitor and a third saturable inductor, and an output capacitor coupled in parallel to the third stage.

30. The system of claim 29, further comprising a transformer, said transformer having a primary winding and a secondary winding, said primary winding being coupled to one of said stages and said secondary winding being coupled to a next stage.

31. The system of claim 26, further comprising a linear inductor, said linear inductor being coupled in series with said switch.

32. The system of claim 26, further comprising a second capacitor coupled to said capacitor for storing a charge.

33. The system of claim 26, wherein said inverting circuit comprises an inductor.

34. The system of claim 26, further comprising a power source, said power source providing said charge to said capacitor.

35. The system of claim 26, wherein said laser is operable on a transverse discharge.

36. The system of claim 26, further comprising a transformer, said transformer having a primary winding and a secondary winding, said primary winding being coupled to the output of said magnetic pulse compressor circuit and said secondary winding being coupled to said laser.

37. A high voltage pulse power laser system comprising:

a power source;

a pulse compressor circuit having a solid state switch coupled to said power source, said pulse compressor circuit also having at least one stage, said at least one stage comprising a capacitor and a saturable inductor;

a biasing circuit for encouraging the inductor of the at least one stage into reverse saturation; and a laser coupled to the output of said pulse compressor circuit;

said pulse compressor circuit providing compressed power to said laser in response to power input from said power source through the solid state switch, said compressor circuit providing a forward current output pulse in response to the power input, said compressor circuit also maintaining a forward current while resonantly recovering energy not used in said laser by reversing the unused energy and returning the recovered energy to said power source.

38. The system of claim 37, wherein said pulse compressor circuit comprises a second stage comprising a second capacitor and a second saturable inductor.

39. The system of claim 37 wherein said pulse compressor circuit further comprises a linear inductor coupled in series with said switch.

40. The system of claim 37, further comprising a capacitor coupled to said power source for storing energy.

41. The system of claim 37, wherein said pulse compressor 20 circuit further comprises an inverting circuit, said inverting circuit comprising an inductor.

42. The system of claim 37, wherein said laser is operable on a transverse discharge.

43. The system of claim 42, wherein said laser is an excimer laser.

44. The system of claim 37, further comprising a transformer, said transformer having a primary winding and a secondary winding, said primary winding being coupled to the output of said pulse compressor circuit and said secondary winding being coupled to said laser.

45. The system of claim 37, wherein said pulse compressor circuit comprises a third stage comprising a third capacitor and a third saturable inductor, and an output capacitor coupled in parallel to the third stage.

46. The system of claim 45, further comprising a transformer, said transformer having a primary winding and a secondary winding, said primary winding being coupled to one of said stages and said secondary winding being coupled to a next stage.

47. A method of recovering energy in a laser system, comprising the steps of:

periodically applying a charge as an input to a pulse compressor circuit having at least one stage, said at least one stage comprising a capacitor and a saturable inductor;

providing a biasing circuit for encouraging the inductor of the at least one stage into reverse saturation;

providing a forward current output pulse to said laser system in response to the input, said compressor circuit maintaining a forward current while resonantly providing a reverse charge that is reflected by said laser system;

recovering said reverse charge by inverting said reverse charge to obtain an inverted charge; and providing said inverted charge as part of the input to said compressor circuit in a next output pulse.

48. The method of claim 47, wherein in said periodically applying step, said pulse compressor circuit comprises a second stage comprising a second capacitor and a second saturable inductor.

49. The method of claim 48, wherein said pulse compressor circuit comprises a third stage comprising a third capacitor and a third saturable inductor, and an output capacitor coupled in parallel with the third stage.

50. The method of claim 49, further comprising a transformer, said transformer having a primary winding and a secondary winding, said primary winding being coupled to one of said stages and said secondary winding being coupled to a next stage.

51. The method of claim 47, wherein said periodically applying step is applied by means of a solid state switch.

52. The method of claim 51, further comprising a linear inductor, said linear inductor being coupled to said switch.

53. The method of claim 47, further comprising the step of storing said charge in a capacitor prior to said periodically applying step.

54. The method of claim 47, wherein an inverting circuit is used in said recovery step, said inverting circuit comprising an inductor.

55. The method of claim 47, further comprising the step of providing a power source for providing said charge.

56. The method of claim 47, further comprising the step of providing said output pulse to a transformer, said transformer having a primary winding and a secondary winding, said primary winding being coupled to the output of said pulse compressor circuit and said secondary winding being coupled to said load.

57. A high voltage pulse power laser system comprising:

a power source;

a capacitor for storing a charge;

a pulse compressor circuit having a solid state switch coupled to said power source, said pulse compressor circuit also having at least one stage, said at least one stage comprising a capacitor and a saturable inductor;

a biasing circuit for encouraging the inductor of the at least one stage into reverse saturation;

a pulse discharge laser coupled to the output of said pulse compressor circuit; and an inverting circuit coupled in parallel with said capacitor for storing and inverting a reverse charge that is reflected by said pulse discharge laser;

said pulse compressor circuit consistently providing forward current compressed power to said laser without missed pulses in response to power input from said power source through the solid state switch, said pulse compressor circuit maintaining a forward current while resonantly providing a reverse charge which is reflected from the pulse discharge laser.

58. The system of claim 57, wherein said compressor circuit also recovers energy not used in said laser and returns the recovered energy to said power source.

59. The system of claim 57, wherein said laser is a transverse discharge laser.

60. The system of claim 57, wherein said laser is an excimer laser.

61. The system of claim 60, wherein said laser is a KrF excimer laser.

62. The system of claim 57, wherein said pulse compression circuit comprises a second stage comprising a second capacitor and a second saturable inductor.

63. The system of claim 57, wherein said pulse compression circuit comprises a third stage comprising a third capacitor and a third saturable inductor, and an output capacitor coupled to the third stage.

64. The system of claim 57, further comprising a transformer, said transformer having a primary winding and a secondary winding, said primary winding being coupled to one of said stages and said secondary winding being coupled to a next stage.

* * * * *